United States Patent [19]

West

[11] Patent Number: 5,201,974
[45] Date of Patent: Apr. 13, 1993

[54] METHOD AND APPARATUS FOR MAKING PATTERNED ELECTRICALLY CONDUCTIVE STRUCTURES

[76] Inventor: Frederick A. West, 12722 Gorda Cir., Largo, Fla. 34643

[21] Appl. No.: 475,578

[22] Filed: Feb. 6, 1990

[51] Int. Cl.⁵ .............................................. H01B 13/00
[52] U.S. Cl. ........................................ 156/47; 29/830; 118/211; 174/250; 174/255; 156/204; 156/243; 156/246; 156/901; 264/104; 427/96
[58] Field of Search ............... 156/47, 59, 246, 204, 156/242, 243, 629, 630, 901; 174/250, 255, 261; 264/104; 29/830, 848; 427/96; 118/211, 216, 219

[56] References Cited

U.S. PATENT DOCUMENTS

| | | | |
|---|---|---|---|
| 3,258,387 | 6/1966 | Brown et al. | 156/242 X |
| 3,813,773 | 6/1974 | Parks | 29/830 |
| 4,067,945 | 1/1978 | DuRocher | 264/104 |
| 4,285,780 | 8/1981 | Schachter | 29/830 X |
| 4,604,160 | 8/1986 | Murakami et al. | 174/255 X |
| 4,673,904 | 6/1987 | Landis | 174/261 X |
| 4,775,439 | 10/1988 | Seeger et al. | 156/246 X |
| 4,912,020 | 3/1990 | King et al. | 427/96 X |

*Primary Examiner*—Caleb Weston
*Assistant Examiner*—Michele K. Yoder
*Attorney, Agent, or Firm*—Charles A. McClure

[57] ABSTRACT

Patterned electrically conductive structures, such as circuit elements, in single or multiple laminar form, and their manufacture. The basic laminar structure is made by sizing a removable substrate to substantially equal depth with an electrically conductive material over a given area configured as a circuit element and with an electrically non-conductive material elsewhere, bonding the respective sizing materials in place and together, and separating the substrate to leave a lamina of electrically conductive and non-conductive materials side-by-side. Face-to-face juxtaposition of such substrate-less laminae provides built-up or laminated products.

23 Claims, 4 Drawing Sheets

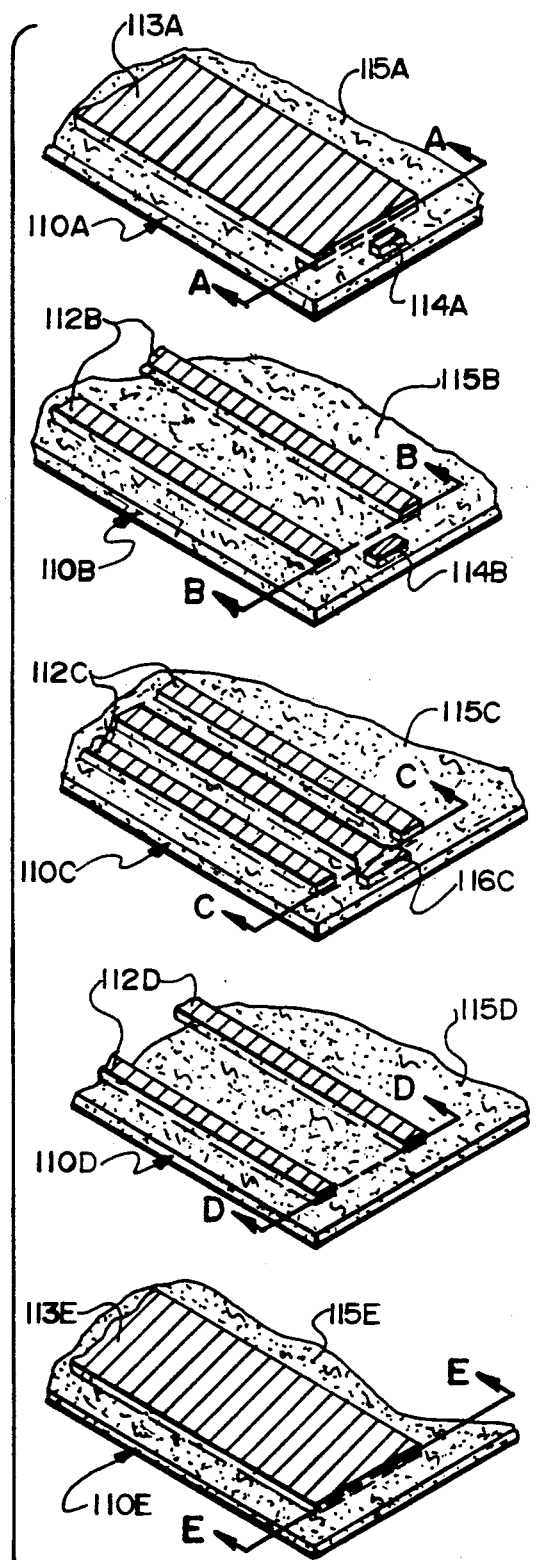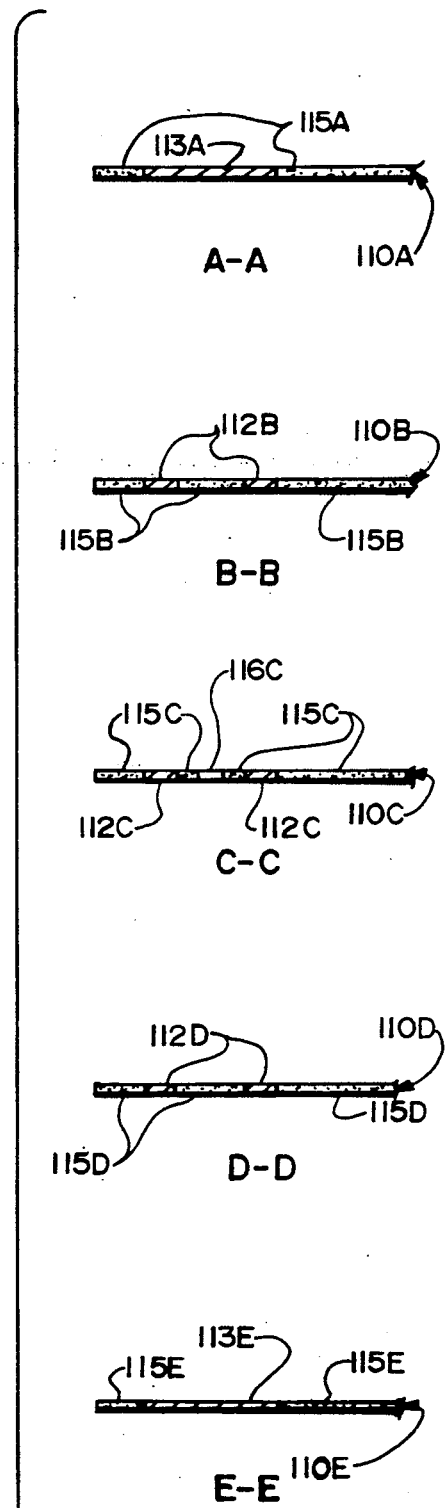
FIG. 11
FIG. 12

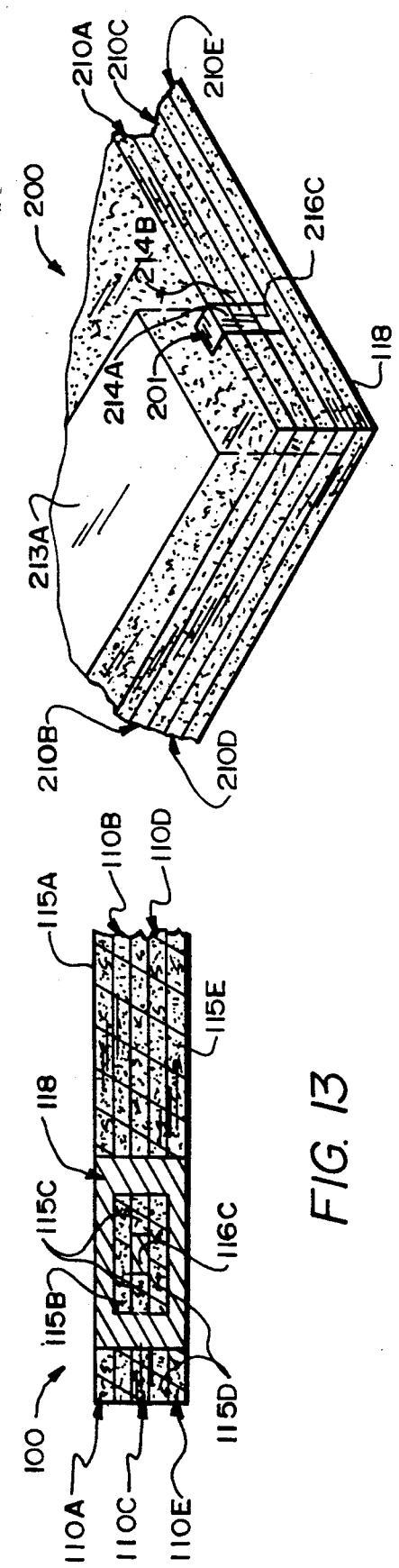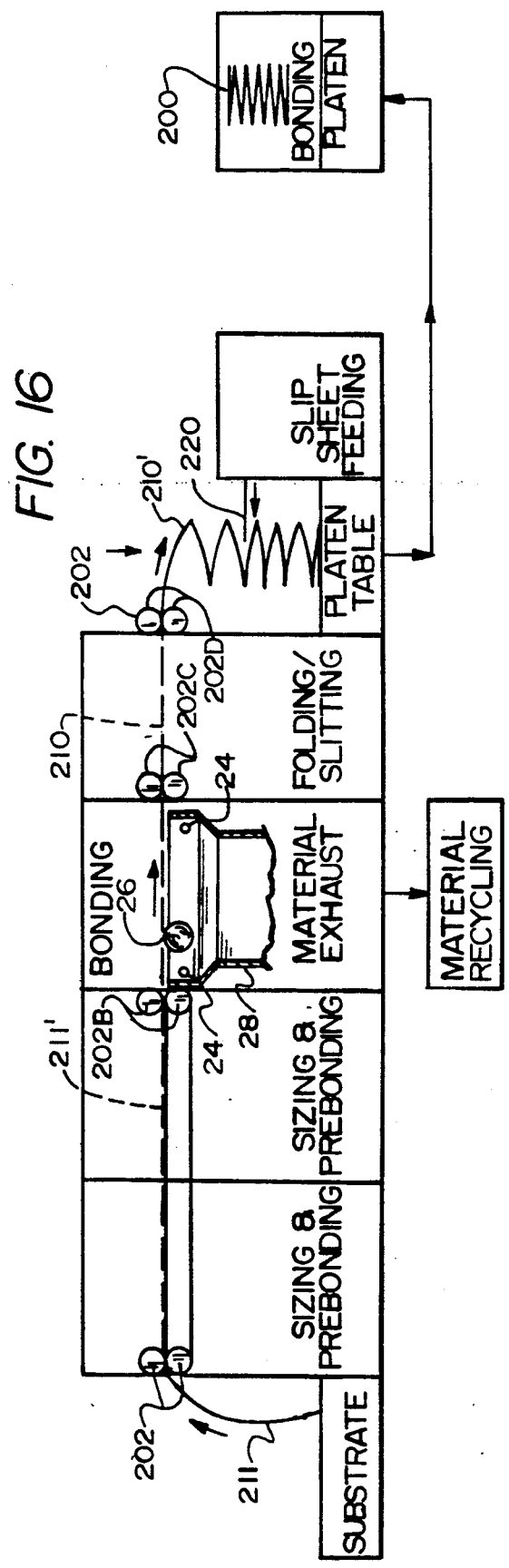

METHOD AND APPARATUS FOR MAKING PATTERNED ELECTRICALLY CONDUCTIVE STRUCTURES

TECHNICAL FIELD

This invention relates to patterned electrically conductive structures, such as circuit elements or circuitry in laminar form, and to manufacture thereof.

BACKGROUND OF THE INVENTION

Numerous electrical products include at least one solid layer of non-conductive substrate carrying one or more patterned layers of electrical conductors. Examples include printed circuit boards in which conductive layers are—or are adapted to be—interconnected at given points, and often are further adapted to have lumped circuit elements mounted thereon or otherwise connected thereto.

Making such PC boards is complex and demands extreme degrees of precision, sanitation, and testing that are troublesome to attain and expensive to maintain. Interconnection integrity, especially between layers, is a frequent problem. Although PC board manufacture has given rise to many successful inventions, the state of the art leaves much to be desired in the way of economy and simplicity.

Other articles of quite different form, such as coaxial cables, and wiring harnesses, for example, pose additional problems, some being associated with conduction over much greater distances. Yet a new approach to those problems conceivably could solve them all, and that is just what my departure from the prior art is designed to do.

SUMMARY OF THE INVENTION

A primary object of this invention is to provide a structure configured with conductive solid material in given areas, and with non-conductive solid material elsewhere as a self-supporting lamina.

Another object of the invention is to provide structures built up from a plurality of such laminae juxtaposed face-to-face.

A further object is to manufacture the foregoing structures in continuous manner, as well as batchwise or intermittently.

In general, the objects of the present invention are attained in laminar structures having patterned solid conductive material within given areas and non-conductive material elsewhere configured side-by-side, whether as a single lamina, or a structure embodying a laminated plurality of such laminae in mutually contiguous form.

More particularly, such a basic laminar structure is made by sizing a removable substrate to substantially equal depth with an electrically conductive material over a given area configured as a circuit element or circuit, and with an electrically non-conductive material elsewhere, bonding the respective sizing materials in place and together, and separating the substrate to leave a single lamina of electrically conductive/non-conductive materials side-by-side.

SUMMARY OF THE DRAWINGS

FIG. 1 is a fragmentary perspective view of substrate material for use in forming such first laminar embodiment of the invention;

FIG. 2 is an edge elevation of substrate material of FIG. 1;

FIG. 3 is a fragmentary perspective view of the material of FIGS. 1 and 2 at a conductive sizing stage of being processed into a first laminar product embodying this invention;

FIG. 4 is a sectional edge view of the material as in FIG. 3;

FIG. 5 is a fragmentary perspective view of the same embodiment at a non-conductive sizing stage of such processing;

FIG. 6 is an edge elevation of such embodiment as in FIG. 5;

FIG. 7 is a fragmentary perspective view of the same embodiment at an optional material removal stage in further processing;

FIG. 8 is an edge elevation of such embodiment as in FIG. 7;

FIG. 9 is a similar perspective view of the same embodiment completed as a first laminar product embodying the invention; and FIG. 10 is a sectional elevation (at X—X on FIG. 9) of the first product embodiment, a single lamina made up of side-by-side electrically conductive and non-conductive parts of like thickness.

FIGS. 11 through 13 illustrate an example of the processing of a second laminar product of this invention embodying a plurality of such individual laminae, into a built-up or laminated structure.

FIG. 11 is a fragmentary exploded perspective view of a set of laminae for forming a second structural embodiment of the invention;

FIG. 12 is a composite of edge elevations of the respective laminae of FIG. 11; and FIG. 13 is an edge elevation of that second product embodiment, in the form of a built-up laminate of individual laminae (each made up of side-by-side electrically conductive and non-conductive parts) with cross-sectional appearance and structure of a coaxial cable.

FIGS. 14 through 16 exemplify a process, according to this invention, for producing, in a continuous process, first the single laminar embodiment of the early figures, and second the laminated multiple or built-up second laminar embodiment shown in FIG. 13.

FIG. 14 is a schematic block/flow diagram of steps of such a continuous process for making the first and second embodiments;

FIG. 15 is a perspective view of the exemplified material at a given stage in such continuous process, plus related apparatus; and FIG. 16 is a perspective view of the laminated laminar product resulting from the practicing of the process comprising such steps, being equivalent to the second product embodiment shown in FIG. 13.

DESCRIPTION OF THE INVENTION

Figure 1:
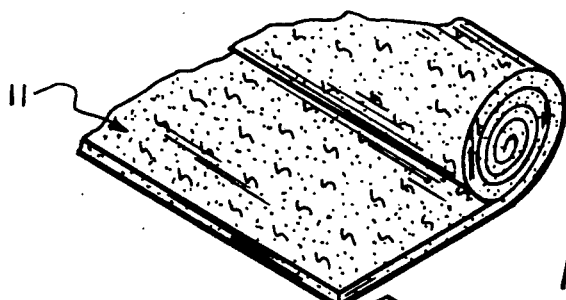
FIGS. 1 through 10 illustrate an example of processing certain materials into a first structural embodiment of this invention, in pairs of comparable odd-numbered perspective views and even-numbered edgewise elevations or sectional views.
Figure 2:

FIGS. 1 and 2 show, in fragmentary perspective and edge elevation, respectively, a preparatory rudiment of the first embodiment, comprising sheet 11 of removable substrate material shaded to suggest paper or non-woven textile, for example. No supporting surface is shown, but it will be apparent that the substrate could be supported on an underlying flat surface or be gripped edgewise or in the nip of pairs of cylindrical rolls and thereby be held flat.

Figure 3:
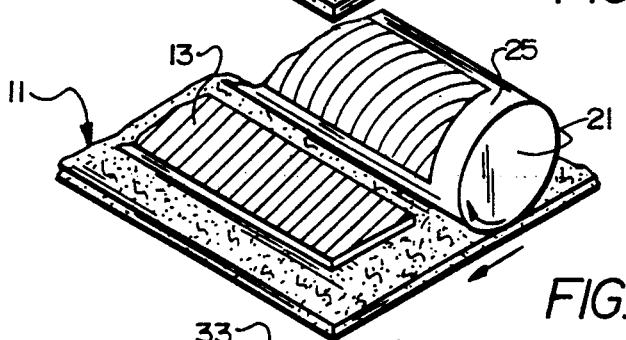
Figure 4:
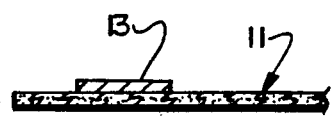

FIGS. 3 and 4 show, similarly, substrate sheet 11 coated, as by electrically conductive material 13 in a defined (generally rectangular) area on its upper surface and shaded to suggest metal. One way of applying such material is suggested by roll 21 overlying the sheet, carrying on a correspondingly rectangular area 23 thereof a transferable layer of such material, and rotating (curved arrow) in non-slipping contact with the underlying top substrate surface to give it relative movement in a given direction (straight arrow).

Figure 5:
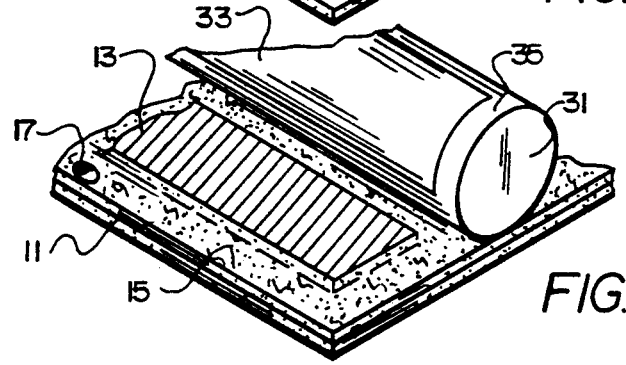
Figure 6:
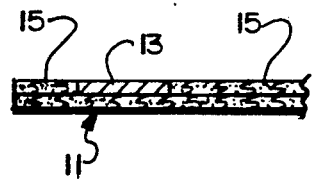

FIGS. 5 and 6 show, similarly, substrate sheet 11 coated with a rectangular layer of conductive material 13 and coated elsewhere, with coating 15 of non-conductive material, but leaving small circular area 17 uncoated. Roll 31, similar to roll 21, but carrying a transferable layer of non-conductive material 35, instead of conductive material, is shown, with a small round resist area (27, not visible here) upon its surface to preclude it from carrying such material there and thus to avoid coating small round area 17.

Figure 7:
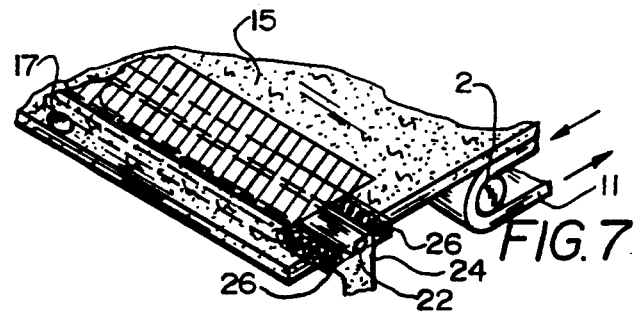
Figure 8:
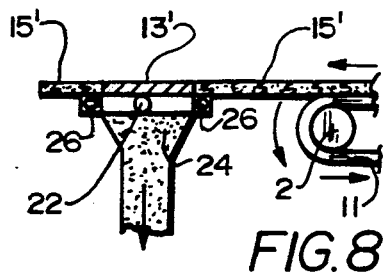

FIGS. 7 and 8 show, similarly, separation of substrate sheet 11 in suitable manner after the applied side-by-side conductive and non-conductive materials have bonded in place and together, with or without application of added radiant or chemical agent (not shown), sufficiently to become substantially self-supporting (i.e., preliminarily bonded or simply "prebonded"). Substrate separation or removal is accomplished here by means of roll 2 about which endless loop of substrate 11 is forwarded on a return flight. Optional (here) funnel-like exhaust device 24 underlies lamina 10, and carries revolving cylinder 22 and adjacent transducer pair 26, as for heating/cooling and/or cleaning/removing residual material from the lamina, perhaps aiding conversion of residue into gaseous, liquid, or fragmented solid form, for withdrawal through exhaust conduit 26 or otherwise to a recycling location. At this stage the sizing materials (redesignated 13' and 15') are self-supporting and can be supported on an underlying flat surface or be gripped at the edges and thereby be held flat, if desired, or be nipped between one or more pairs of cylindrical rolls (not shown here, see next view).

Figure 9:
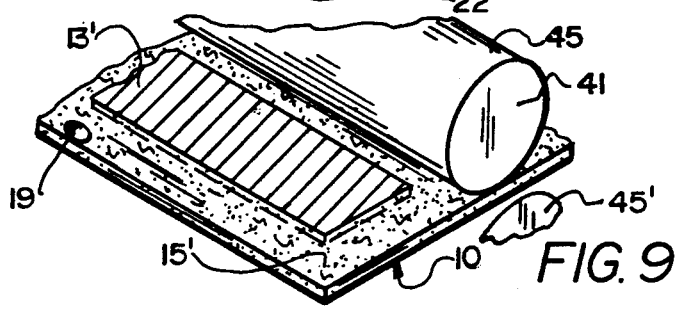
Figure 10:
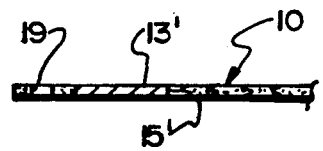
Figure 15:
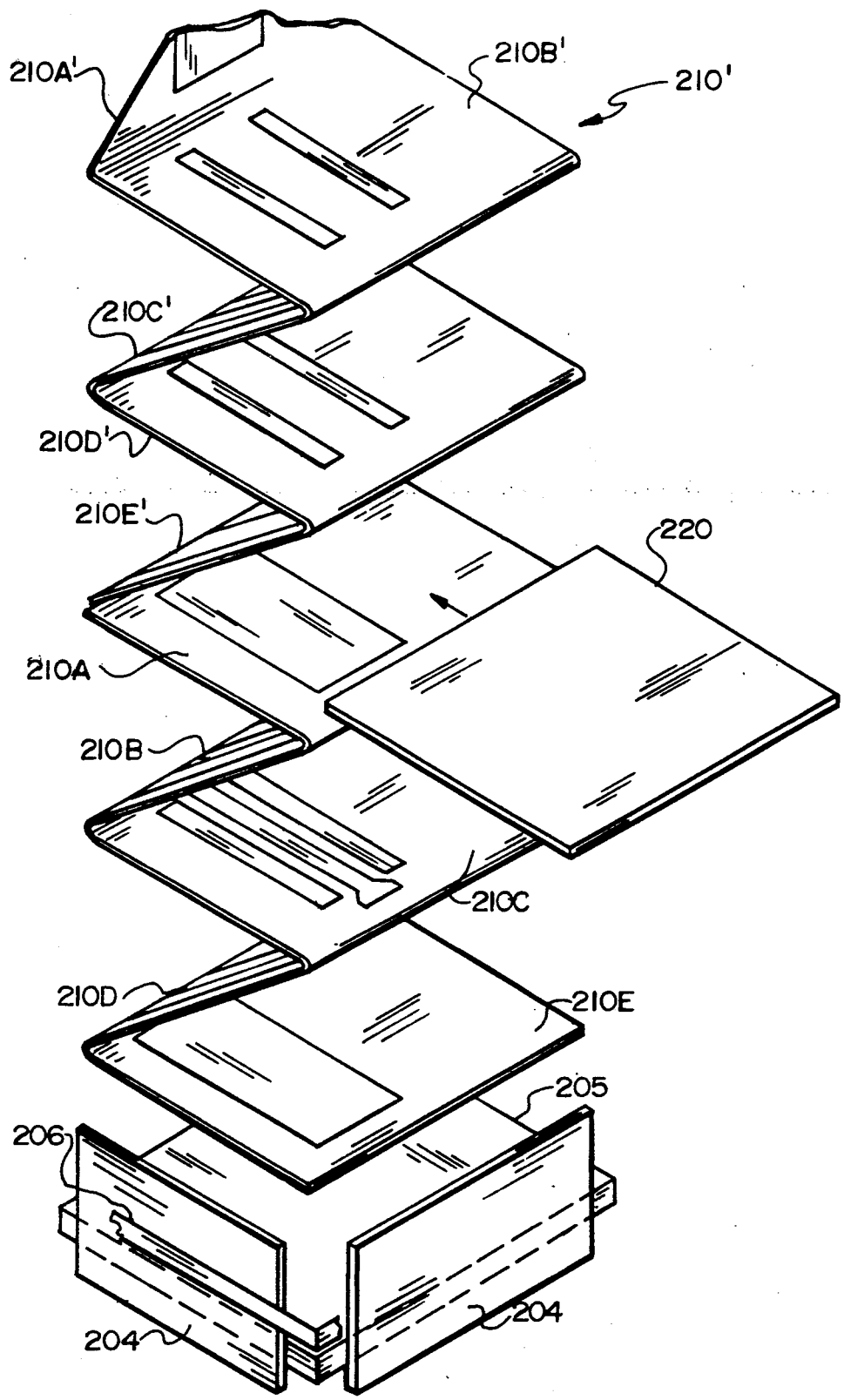

FIGS. 9 and 10 show, similarly, resulting laminar embodiment 10 in the form of a single lamina of substantially uniform thickness forwarded by nip rolls 45, 45'. Hole 19 therethrough corresponds to former portion 17, left unsized. A plurality of such laminae may be juxtaposed to build up multi-laminar or laminated structures.

FIGS. 11 and 12 show, in sequential pairs of exploded perspective and edge sectional views, embodiment 100 of this invention, composed of laminae 110A, 110B, 110C, 110D, and 110E individually exemplified (variously patterned) by the described first embodiment and juxtaposed into mutual contiguity to give a markedly three-dimensional thicker product than the thin constituent laminae.

Top lamina 110A has large rectangular conductive portion 113A, small rectangular conductive portion 114A spaced from the narrow end of portion 113A and near an edge of non-conductive portion 115A laterally surrounding the conductive portions—on all sides, as distinguished from the upper and lower surfaces.

Second lamina 110B has pair of narrow strips 112B parallel to one another, underlying the long edges of portion 110A of lamina 110A, with their outer edges spaced apart the width of portion 110A. This second lamina also has small rectangular portion 114B underlying like portion 114A of lamina 110A, and has more extensive non-conductive portion 115B laterally surrounding the conductive parts.

Third lamina 110C, in the middle vertically, has a like pair of narrow conductive strips 112C aligned with strips 112B of lamina 110B, and has narrow strip 116C along and midway between that pair of strips and terminating in a headed rectangular end underlying the like portion of immediately overlying lamina 110B. It also has non-conductive portion 115C surrounding the conductive portions.

Fourth lamina 110D has only pair of narrow conductive strips 112D, underlying the other pairs of such strips, and surrounded laterally (on all sides) by non-conductive portion 115D.

Bottom lamina 110E has large rectangular conductive portion 110E matching the corresponding portion of the top lamina, but no smaller rectangular portion to match portion 114A.

In actual embodiment 100, the foregoing individual laminae, notwithstanding their vertical separation in FIGS. 11 and 12, are mutually contiguous from top to bottom, as shown in the next view.

FIG. 13 shows in sectional elevation such resulting laminated laminar embodiment 100, wherein conductive portions 113A, 112B, 112C, 116C, 112D, and 113E form a waveguide with rectangular cross-section and with coaxial conductor 116C supported laterally therein by non-conductive portion 115C of former lamina—now layer—110C; is supported above by non-conductive portion 115B of layer 110B; and is supported below by non-conductive portion 115D of layer 110D. Top layer 110A provides top conductive wall portion 113A of layer 110A, and bottom layer 110E provides bottom conductive wall portion 113E of the coaxial waveguide structure. The sidewalls are composed of conductive portions 112C, 112D, and 112E. Of course, for waveguide purposes, the dielectric provided by the intervening parts of non-conductive material is appropriate. The layers in such laminated structure are bonded together, as by heat exposure in an autoclave (i.e., subsequently bonded or simply "postbonded").

FIG. 14 shows, in block form, conversion of the above described materials into product embodiment 200 via more continuous processing in place of intermittent or batchwise operation. The sizing rolls previously shown are omitted for simplicity of illustration. Here an endless length of substrate 211 is withdrawn from a supply of SUBSTRATE at the left, as by lifting from a storage bin (or unwinding from a supply cylinder), and is forwarded, usually by nip rolls 202A (succeeded by like roll pairs 202B, 202C, and 202D at later stations). Unsized substrate 211 traverses successive (two shown) SIZING & PREBONDING station(s), where conductive and non-conductive sizing materials are applied thereonto side-by-side, as from printing rolls and/or through screens, and are prebonded to render them individually coherent.

Next the sized substrate composite enters BONDING and optional MATERIAL EXHAUST station, where the respective sizings are prebonded further to ensure their mutual adherence, and substrate 11 is separated from resulting lamina 210 (or vice versa). Also any carry-over of residual substrate or other material is exhausted and then removed to a MATERIAL RECYCLING station. Roll 2; if not being used to scavenge residual material from the lamina, can help to support it during further bonding. Optionally the entire substrate is pre-destined for one-time use only and is removed somehow, as by exposure to airflow, radiant heating and/or ultra-violet light, other energy transducers, frangibilizing agents, solvents, etc.

Only self-supporting lamina 210, made up of coherent side-by-side conductive and non-conductive patterned portions, emerges from the BONDING & MATERIAL EXHAUST station to enter a FOLDING/SLITTING station, from which it emerges onto a PLATEN TABLE, where it accumulates in folded or accordion-pleated configuration (now designated 210'). The folded lamina receives periodically, from an adjacent SLIP-SHEET FEEDING station, slip-sheets 220 (one shown) between adjacent folded pagelike parts marking the end of one complete article and the beginning of the next such article in succession, which are not to be bonded together. Where an autoclave comprises at least part of the next (or other succeeding) post-BONDING station—which is more receptive to batches of finite size on a PLATEN than to a continuous flow therethrough—lamina 210' is optionally severed at the FOLDING/SLITTING station, such as at each slip-sheet insertion location, or alternatively at a corresponding length increment.

FIG. 16 shows, in perspective, lamina 210' being deposited from the FOLDING/SLITTING station (not shown here) in folded form onto PLATEN TABLE 205, which has aligning fences 204 upstanding therefrom to receive the accordion-pleats of the lamina in desired position. Successive length intervals fold in opposite directions so that the resulting structure accumulates as a stack of interconnected sheets. Although top, middle, and bottom sheetlike portions 210A, 210C, and 210E of the lamina are in the same relative positions as laminae 110A, 110C, and 110E of the preceding views, portions 210B and 210D (next to the top and the bottom, respectively) are mirror images of preceding corresponding laminae 110B and 110D—as viewed from the same side of continuous lamina 210'—so that mutual juxtaposition of all five such laminae produces an identical coaxial cable product.

FIG. 16 shows, in a perspective view, coaxial cable product 200 of the continuous process just described. This being an exterior view, the edge facing the lower right differs in appearance from the interior sectional edge view of FIG. 13. The converse views (i.e., an interior edge section of product embodiment 200 and an exterior edge elevation of product embodiment 100) would match respective FIGS. 13 and 16, as well. Also visible in FIG. 16 is tie connector 201 formed of stacked conductive portion 214A of top layer 210A, and similar portion 214B of next layer 210B, plus the near end of center conductor 216C of middle layer 210C.

The described and illustrated embodiments are only examples, of course, and numerous others may be constructed in similar manner, as will be readily apparent to persons skilled in the art.

Not only can laminae be produced free of supporting substrates, but circuit elements can be produced by building up or laminating a plurality of such laminae. Thus, a capacitor can be constructed from upper and lower conductive portions and an intervening non-conductive portion. In addition to constructing circuit elements, such as the exemplary coaxial waveguide, the present invention may be employed to capture or otherwise accommodate existing circuit elements or leads thereto, as within an opening left in one or more laminar layers by omitting sizing from the subsequently removed substrate where an opening is desired. Connections to circuit elements created in situ or captured or left outside are readily made via adjacent conductive parts of one or more adjacent layers or by leads inserted through resulting openings. In short, this invention is so versatile that an infinite variety of circuit boards can readily be so constructed. Moreover, such construction is very inexpensive.

This invention does not require rare or exotic compositions but is adapted to being practiced with readily available materials. Thus, the substrate may be composed of fibrous material, such as paper or non-woven fabric, or non-fibrous material, such as film, whether of organic thermoplastic or thermosetting polymers, or inorganic material, such as glass, ceramic, or siloxane. Mixed organic-inorganic materials may be used, such as an organic polymeric film reinforced with an inorganic fibrous material. An example of such a suitable mixed material is epoxy resin reinforced with glass fibers. Fixed substrates may be used, and resulting laminae be peeled off.

Flexible belts of such substrate compositions may be employed in endless looped form, as shown, and be separated from the formed lamina by bending away and around a rotating cylindrical roll. Such substrate materials retain their physical integrity while forwarded around roll assemblies, whether run continuously or intermittently.

Alternatively, the substrate may be made of readily removable material, such as low-melting or readily soluble or even vaporizable organic material (e.g. low degree of polymerization polyalkylene) or of inorganic material such as a solder. Such a substrate can be sized at a sufficiently low temperature to remain solid throughout prebonding of the sizing material, and subsequently be separated by melting near room temperature or moderately higher. Alternatively, the substrate may stable at room temperature but frangible at reduced temperature, such as an elastomer or unstable crystallite. Given such substrates, removal can be accomplished readily by energy exchange (heating/cooling) with or without physical or chemical assistance, such as brushing, sonic fracturing, solvent spraying, etc.

The sizing materials may be similar to some of the substrate materials but be supplied in paste form rather than as a coherent solid material. Thus, a non-conductive sizing material may comprise a thermoplastic organic polymer, such as an acrylic or vinyl resin or a polyester, or a thermosetting polymer, such as an epoxy resin or a phenol-formaldehyde or melamine-formaldehyde resin. Solvent or plasticizer for such polymer may be present in the sizing material, with or without inert diluent, and be evaporated therefrom by prebonding exposure to ambient air (usually with heating) after having been sized onto the substrate. Alcohols, aldehydes, esters, ethers, ketones, and mixtures thereof may serve such purpose. Examples include butyl acetate, butyl carbitol, and methyl ethyl ketone.

Suitable curing temperatures depend upon the resins used, but a range suited to many of the compositions is from about ten to thirty minutes at from about 100° to 200° C., usually in the mid-range of both time and temperature. Substitution of more intense infra-red radiation sources is often effective to reduce the time to less than half, even to a fifth or even a tenth, of the first stated range.

An electrically conductive sizing material may closely resemble the non-conductive paste compositions just mentioned, but with added conductive particulate material, such as metallic powder or flakes, or even non-metallic material such as graphite. Suitable metallics include aluminum, copper, gold, indium, lead, silver, tin, and the platinum group metals. Upon evaporation of solvent therefrom, the conductive particulates are retained in intimate mutual contact by a reticulated matrix or network of micromolecular polymeric strands.

Such paste compositions, though they are specialty chemicals, are articles of commerce and readily available, as from Minico/Asahi Chemical of America, in Congers, N.Y., for example. Thay are suitable for screening through about 100 to 300 mesh, as are mixes of them.

Preferred embodiments and variants have been suggested for this invention. Other modifications may be made, as by adding, combining, deleting, or subdividing compositions, parts, or steps, while retaining all or some of the advantages and benefits of the present invention—which itself is defined in the following claims.

The claimed invention:

1. Method of forming a self-supporting substrate-less laminar structure with patterned electrical circuitry portions, comprising the steps of
   sizing a removable flexible substrate strip with both
      a bondable electrically conductive sizing material in the configuration of at least one circuit element pattern, and
      a bondable electrically non-conductive sizing material in lateral contiguity with the configured conductive sizing material; wherein the sizing materials comprise a configurable composition adapted to be consolidated into self-supporting condition upon bonding exposure, including heating above ambient temperature;
   bonding the respective sizing materials in place and together after each sizing step, including one or more steps of so exposing the sized substrate to bonding temperature, thus consolidating both the conductive and the non-conductive sizing materials into a single self-supporting substrate-less lamina;
   flexing and removing the substrate to leave the electrically conductive and non-conductive materials bonded together as a single lamina without any covering layer;
   including configuring the sizing materials on length segments of the substrate strip as a succession of identical side-by-side patterns, and then transversely severing lengths thereof from one another, each as a self-supporting lamina containing a preselected number of identically patterned length segments.

2. Method of forming a self-supporting substrate-less laminar structure with patterned electrical circuitry portions, comprising the steps of
   sizing a removable flexible substrate strip with both
      a bondable electrically conductive sizing material in the configuration of at least one circuit element pattern, and
      a bondable electrically non-conductive sizing material in lateral contiguity with the configured conductive sizing material; wherein the sizing materials comprise a configurable composition adapted to be consolidated into self-supporting condition upon bonding exposure, including heating above ambient temperature;
   bonding the respective sizing materials in place and together after each sizing step, including one or more steps of so exposing the sized substrate to bonding temperature, thus consolidating both the conductive and the non-conductive sizing materials into a single self-supporting substrate-less lamina;
   flexing and removing the substrate to leave the electrically conductive and non-conductive materials bonded together as a single lamina without any covering layer;
   including configuring the sizing materials on length segments of the substrate strip as a succession of dissimilar side-by-side patterns, and then transversely severing lengths thereof from one another, each as a self-supporting lamina containing a preselected number of dissimilarly patterned length segments.

3. Method according to claim 2, including folding the lamina transversely along its length segment junctions, and thereby juxtaposing face-to-face adjacent length segments, and bonding the juxtaposed length segments face-to-face, thus laminating them into a patterned electrically conductive structure.

4. Method of forming laminated structures with patterned electrical circuitry portions, comprising the steps of
   sizing adjacent segments of a flexible removable substrate to uniform depth over substantially all of its useful surface with
      a bondable electrically conductive sizing material in configuration of a plurality of side-by-side circuit patterns, and
      a bondable electrically non-conductive sizing material side-by-side with the configured conductive sizing material,
      the conductive material and the non-conductive material each being free from overlapping or underlapping the other material;
   preliminarily bonding the respective sizing materials laterally together;
   removing the substrate to leave the electrically conductive and non-conductive materials prebonded together as a substrate-less single self-supporting lamina;
   juxtaposing adjacent segments of the resulting lamina corresponding to side-by-side circuit patterns face-to-face; and
   subsequently autoclaving and thereby bonding the juxtaposed segments together as a circuit laminate.

5. Method according to claim 4 including the step of preliminarily bonding one sizing material on the substrate before adding the other sizing material and then bonding it thereon and bonding the respective sizing materials side-to-side to each other.

6. Method according to claim 4, including providing flexible substrate material selected from the group consisting of papers and non-woven fabrics, glasses, ceramics, organic thermoplastic polymers and thermosetting polymers, and siloxane polymers.

7. Method according to claim 4, wherein the electrically conductive sizing material comprises metallic particulates and organic materials adapted to form a polymeric matrix about such particulates to maintain them in mutual conductive contact.

8. Method according to claim 7, including providing particulates comprising at least one one of aluminum, copper, gold, graphite, indium, lead, silver, tin, and the platinum group metals.

9. Method according to claim 4, including severing adjacent length segments of the lamina transversely before juxtaposing them.

10. Method according to claim 4, including folding adjacent length segments of the lamina transversely before juxtaposing them.

11. Continuous method of forming multiple copies of electrical circuitry, comprising the steps of forwarding a flexible substrate strip having a plurality of distinguishable length segments substantially continuously past a plurality of sizing locations, sizing such substrate succession of length segments, each with an electrically conductive material in the configuration of at least one circuit element pattern, and with an electrically non-conductive material side-by-side in only lateral contiguity with the configured conductive sizing material;

preliminarily bonding the respective sizing materials laterally together in place, thereby rendering them self-supporting in the absence of the substrate; and removing the substrate strip to leave a bonded self-supporting substrate-less lamina of such materials as a succession of distinguishable length segments joined end-to-end.

12. Method according to claim 11, including the steps of transversely accordion-folding such lamina along the segment junctions to juxtapose adjacent distinguishable length segments of successive copies for bonding together, and bonding adjacent length segments of individual copies together face-to-face as a multi-layered circuitry laminate.

13. Method according to claim 12, including also the step of placing release means between the last length segment of each such copy and the first length segment of the next following copy during folding to prevent successive copies from bonding to one another.

14. Method according to claim 12, including severing the strip along the junction between the last distinct length segment of each copy and the first distinct length segment of the next copy.

15. Method according to claim 13, including aligning substrate portions between aligning fences on supporting means before bonding.

16. Means adapted to configure self-supporting substrate-less laminar structures with patterned electrical circuitry portions, comprising a bondable electrically conductive sizing material, a bondable electrically non-conductive sizing material, and a flexible substrate adapted to be sized with the sizing materials side-by-side to like depth and further adapted to be removed when the materials sized thereonto are in such condition as to be self-supporting absent the substrate;

sizing means adapted to size the substrate with configured electrically conductive sizing material and non-conductive sizing material side-by-side in lateral contiguity with one another to like depth as successive length intervals;

preliminary bonding means adapted to bond the respective sizing materials together to be self-supporting in the absence of the substrate;

means adapted to flex and remove the flexible substrate to leave the electrically conductive and non-conductive materials bonded laterally together as a single self-supporting substrate-less lamina;

means adapted to juxtapose successive length segments of the resulting lamina face-to-face; and means adapted to bond the juxtaposed length segments together in an electrically patterned circuitry laminate.

17. Means according to claim 16, including an endless-loop reusable substrate, supporting rolls around which it is loped, and drive means for rotating the rolls to travel and flex the substrate.

18. Means according to claim 16, including a non-reusable temporary substrate, and means other than supporting rolls for flexing the substrate and thus separating the substrate and the resulting lamina.

19. Means according to claim 16, including lamina folding means and lamina slitting means.

20. means according to claim 19, including slip-sheet feeding means synchronized with the folding means.

21. Means adapted to produce patterned circuit laminates made up of face-to-face juxtaposed self-supporting substrate-less laminar structures with patterned electrical circuitry portions, comprising a heat-bondable electrically conductive sizing material, and a heat-bondable electrically non-conductive sizing material;

a flexible strip substrate on supporting rolls and adapted to be sized with the sizing materials side-by-side to like depth in preselected patterned configuration, and further adapted to be removed by flexing about a roll after the materials sized onto the substrate are self-supporting absent any substrate;

sizing means adapted to size the substrate with conductive sizing material and non-conductive sizing material in only lateral mutual contiguity to like depth in patterned configuration;

preliminary heat-bonding means adapted to bond the respective sizing materials laterally as a self-supporting striplike lamina of successive segments patterned in like or unlike circuitry patterns;

slitting means adapted to sever the lamina into preselected single-segment lengths or multiple-segment lengths;

means adapted to juxtapose a plurality of the resulting laminae face-to-face into patterned electrical circuitry configuration; and subsequent heat-bonding means adapted to bond the juxtaposed laminae together as a patterned electrical circuitry laminate.

22. Means according to claim 21, together with folding means adapted to fold the resulting lamina between successive segments and further adapted to juxtapose successive segments face-to-face.

23. Means according to claim 21, together with slip-sheet feeding means adapted to insert slip sheets between the end segments of successive multiple-segment lengths, as well as between successive segments of single-segment laminae preliminary to severance of them from one another by the slitting means.

* * * * *